United States Patent
Roberds et al.

(10) Patent No.: US 6,815,310 B2
(45) Date of Patent: Nov. 9, 2004

(54) TECHNIQUE TO OBTAIN HIGH MOBILITY CHANNELS IN MOS TRANSISTORS BY FORMING A STRAIN LAYER ON AN UNDERSIDE OF A CHANNEL

(75) Inventors: Brian Roberds, Beaverton, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 10/366,771

(22) Filed: Feb. 14, 2003

(65) Prior Publication Data

US 2003/0148584 A1 Aug. 7, 2003

Related U.S. Application Data

(62) Division of application No. 09/752,333, filed on Dec. 29, 2000, now Pat. No. 6,563,152.

(51) Int. Cl.[7] ............................................. H01L 21/76
(52) U.S. Cl. ..................................................... 438/421
(58) Field of Search .................................. 438/411, 421

(56) References Cited

U.S. PATENT DOCUMENTS

| 5,232,866 A | * | 8/1993 | Beyer et al. ................. 438/619 |
| 5,891,793 A | | 4/1999 | Gardner et al. |
| 5,955,745 A | | 9/1999 | Yamazaki |
| 6,060,387 A | | 5/2000 | Shepela et al. |
| 6,069,046 A | | 5/2000 | Gardner et al. |
| 6,111,292 A | | 8/2000 | Gardner et al. |

OTHER PUBLICATIONS

Ghandhi Sorab K., "Ion Implantation", VLSI Fabrication Principles.

* cited by examiner

*Primary Examiner*—W. David Coleman
(74) *Attorney, Agent, or Firm*—Blakely, Sokoloff, Taylor & Zafman LLP

(57) ABSTRACT

A method for forming a strain layer on an underside of a channel in an MOS transistor in order to produce a mechanical stress in the channel, increasing a mobility of carriers in the channel and an apparatus produced from such a method.

16 Claims, 5 Drawing Sheets

TECHNIQUE TO OBTAIN HIGH MOBILITY CHANNELS IN MOS TRANSISTORS BY FORMING A STRAIN LAYER ON AN UNDERSIDE OF A CHANNEL

CROSS REFERENCE TO RELATED APPLICATIONS

This application is a divisional of application Ser. No. 09/752,333, filed Dec. 29, 2000, now U.S. Pat. No. 6,563,152 and claims the priority of that filing date.

FIELD OF THE INVENTION

A method of obtaining a high mobility channel in a metal-oxide-semiconductor (MOS) transistor is described. More specifically, the present invention describes a method for forming a strain layer on an underside of a channel in the MOS transistor in order to produce a mechanical stress in the channel.

BACKGROUND OF THE INVENTION

A conventional metal-oxide-semiconductor (MOS) transistor generally includes a semiconductor substrate, such as silicon, having a source, a drain, and a channel positioned between the source and drain. A gate stack comprised of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of an MOS transistor, the amount of current that flows through the channel is directly proportional to a mobility of carriers in the channel. Thus the higher the mobility of the carriers in the channel, the more current can flow and the faster a circuit can perform when using high mobility MOS transistors.

One way to increase the mobility of the carriers in the channel of an MOS transistor is to produce a mechanical stress in the channel. A current method for stressing the channel includes depositing a strain layer on an upper surface of the channel. Using this method, after depositing the strain layer, a gate stack is fabricated and the transistor is realized by implanting dopants into the semiconductor substrate forming a source on one side of the gate stack and a drain of the other side of the gate stack. After the dopants are implanted, a high temperature anneal is required to place the dopants on a crystallographic site in the silicon. A disadvantage of this method is that the high temperature anneal tends to relax the strain in the channel to a lower strain level, usually resulting in dislocations and/or diffusion in the channel crystal, decreasing the desired mechanical stress in the channel. As a result, it is difficult to produce a desirable increase in the mobility of the carriers in the channel using the prior art method.

The present invention addresses some of the shortcomings noted above.

BRIEF DESCRIPTION OF THE DRAWINGS

The present invention is illustrated by way of example and is not limited by the accompanying figures.

DETAILED DESCRIPTION OF THE INVENTION

The description discloses a method for forming a strain layer on an underside of a channel in an MOS transistor in order to produce a mechanical stress in the channel, increasing a mobility of carriers in the channel and an apparatus produced from such a method. The following detailed description contains numerous specific details in order to provide a more thorough understanding of the present invention. However, it will be apparent to those skilled in the art to which this invention pertains that the present invention may be practiced without these specific details. In other instances, well-known devices, methods, procedures, and individual components have not been described in detail in order to avoid obscuring the present invention.

Figure 1:
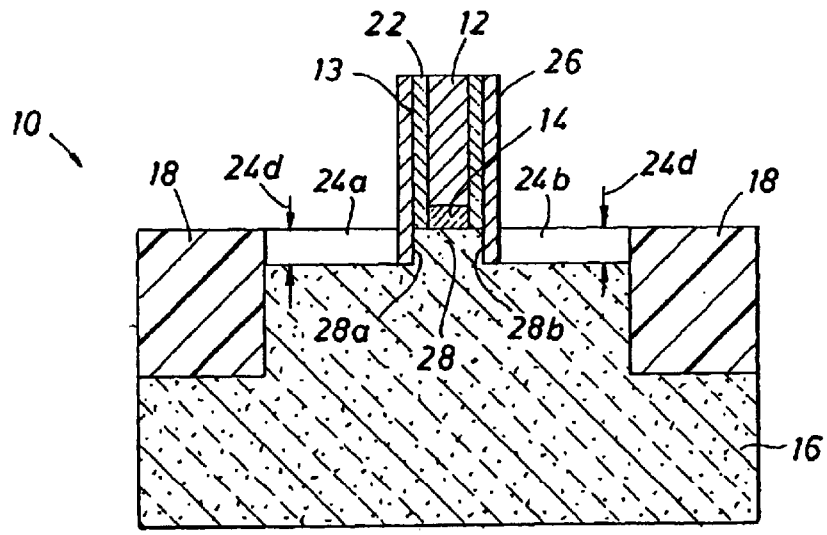
FIG. 1 is a side cross-sectional view of a partially fabricated MOS transistor showing a first removal of a portion of a semiconductor substrate and a formation of a set of sidewall spacers.

FIG. 1 shows a side cross-sectional view of a partially fabricated MOS transistor 10. The fabrication of the transistor 10 generally begins on a semiconductor substrate 16. The semiconductor substrate 16 is typically comprised of silicon and is typically doped at selected locations to form doped regions. In many cases the semiconductor substrate 16 is doped with boron, producing a p-type silicon region, or arsenic or phosphorous, producing an n-type silicon region, although other dopants may be used.

In many cases, the transistor 10 is placed in proximity to a large number of transistors or other devices. To help isolate the transistor 10 from these devices, isolation regions 18, typically comprised of an insulator such as an oxide, are typically formed adjacent to the semiconductor substrate 16. A variety of techniques, including known techniques, can be used to form the isolation regions 18. Examples include, but are not limited to, growing a thermal oxide, depositing an oxide or depositing a nitride.

A gate stack 13 is fabricated atop the semiconductor substrate 16. A variety of techniques, including known techniques, can be used to fabricate the gate stack 13. For example, one gate stack fabrication technique includes depositing a gate oxide layer 14 above the semiconductor substrate 16, and depositing a gate conductor 12, such as polysilicon, above the gate oxide layer 14. Chemical vapor deposition (CVD) is one available technique to form the gate oxide 14 and gate conductor 12. Lithography techniques known in the art can be used to pattern the various gate stack 13 layers. Accordingly, in one embodiment, the gate oxide 14 and the gate conductor 12 are dry etched. Then a first set of sidewall spacers 22, typically comprised of an oxide, is formed adjacent to the gate conductor 12. The gate oxide 14, the gate conductor 12, and the first sidewall spacers 22 are collectively referred to as the gate stack 13. It is to be noted that other techniques can be used to form the gate stack 13.

FIG. 1 also shows a first removal of a portion of the semiconductor substrate 16 adjacent to a channel 28 of the semiconductor substrate 16, wherein the channel 28 underlies the gate stack 13. In one embodiment, the first removal is accomplished by a self-aligned, vertical, anisotropic etch. The anisotropic etch forms open regions 24a and 24b adjacent to the channel 28 in the semiconductor substrate 16. The area remaining under the gate stack 13 and between the open regions 24a and 24b defines the channel 28. The anisotropic etch continues vertically downward until a desired depth 24d is reached.

The depth 24d and therefore the channel 28 height should be sufficiently large such that straining an underside 28c (shown in FIG. 4) of the channel 28 will not disrupt the gate oxide 14/semiconductor substrate 16 interface (i.e. the interface between a lower surface of the gate oxide 14 and an upper surface of the channel 28). At the same time, the channel 28 height should be sufficiently small such that a mechanical stress can be produced in the channel 28 by straining the underside 28c of the channel 28.

In one embodiment, the first removal is accomplished by a timed anisotropic etch, etching into the semiconductor substrate 16 for a predetermined amount of time in order to form the open regions 24a and 24b, wherein the depth 24d of the open regions 24a and 24b, and therefore the channel 28 height, is in the approximate range of 30 to 200 Angstroms.

After the first removal, a second set of sidewall spacers 26 is formed adjacent to the gate stack 13 and extends into the open regions 24a and 24b to protect a first sidewall 28a and a second sidewall 28b of the channel 28. A variety of techniques, including known techniques, can be used to form the second set of sidewall spacers 26. For example, a thin layer of a second sidewall spacer 26 material, such as a nitride, can be conformally deposited on an upper surface of the transistor 10 and a vertical anisotropic etch can be used to form the second sidewall spacers 26 to a desired distance from the sidewalls 28a and 28b of the channel 28. In one embodiment, the second sidewall spacers 26 and the first sidewall spacers 22 are comprised of different materials. For example, the first sidewall spacers 22 can be comprised of an oxide material and the second sidewall spacers 26 can be comprised of a nitride material.

Figure 2:
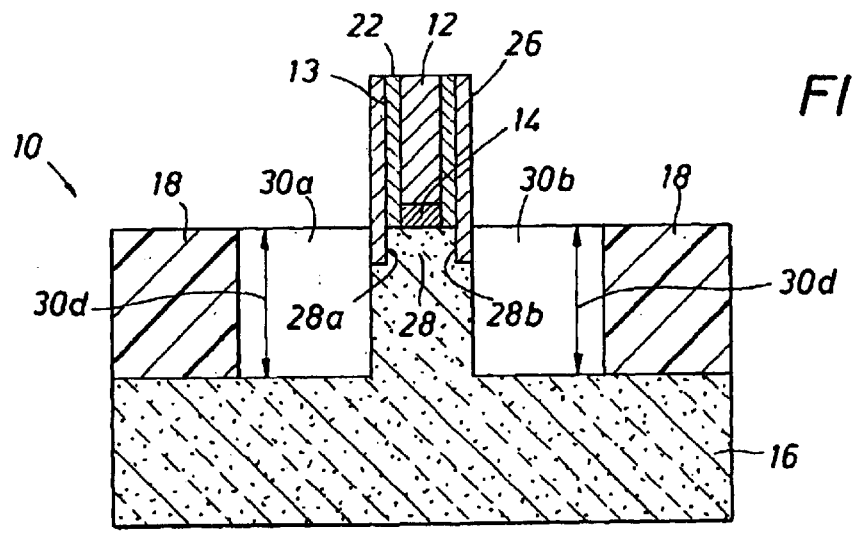
FIG. 2 is a side cross-sectional view of a partially fabricated MOS transistor showing a second removal of a portion of a semiconductor substrate to a structure shown in FIG. 1.

FIG. 2 shows a second removal of a portion of the semiconductor substrate 16. In one embodiment, the second removal is accomplished by a vertical anisotropic etch into the semiconductor substrate 16, aligned with the second sidewall spacers 26. The second removal extends the open regions 24a and 24b further into the semiconductor substrate 16 forming open regions 30a and 30b. The open regions 30a and 30b are formed to a distance 30d below the second sidewall spacers 26 sufficient to allow a removal of a portion of the semiconductor substrate 16 which underlies the channel 28 (shown in FIG. 3). In one embodiment the second removal is accomplished by a timed anisotropic etch, etching into the semiconductor substrate 16 for a predetermined amount of time in order to form the open regions 30a and 30b to the distance 30d below the second sidewall spacers 26 in the approximate range of 50 nanometers to 1 micron.

Figure 3:
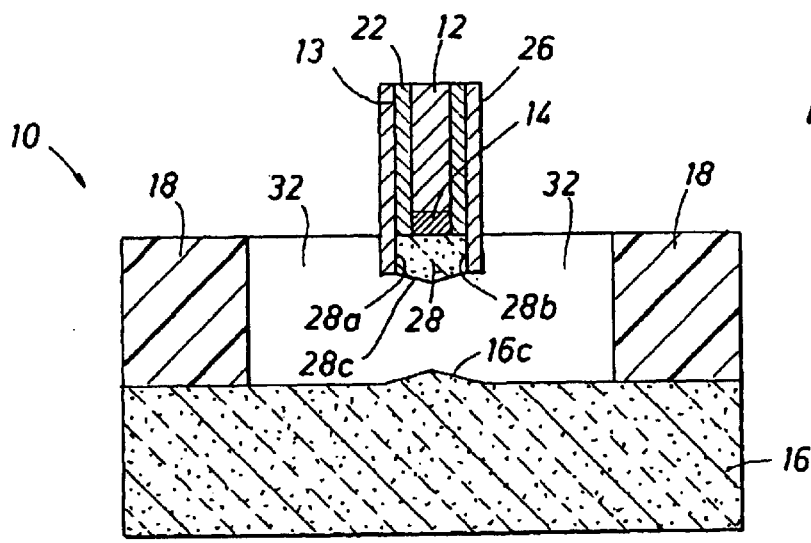
FIG. 3 is a side cross-sectional view of a partially fabricated MOS transistor showing a third removal of a portion of a semiconductor to a structure shown in FIG. 2.

FIG. 3 shows a third removal of a portion of the semiconductor substrate 16. In one embodiment, the third removal is accomplished by an isotropic etch into the semiconductor substrate 16. Since the third removal is isotropic, the third removal extends the open regions 30a and 30b further into the semiconductor substrate 16 forming an open region 32 which underlies a portion of the channel 28, exposing the underside 28c of the channel 28 while leaving the remainder of the channel 28 intact. During the third removal, the second sidewall spacers 26 continue to protect the sidewalls 28a and 28b of the channel 28.

In one embodiment, the third removal is accomplished by a timed isotropic etch, etching into the semiconductor substrate 16 for a predetermined amount of time until the open region 32 underlies a portion of the channel 28, exposing a portion of the channel underside 28c. In another embodiment, the third removal continues until the entire channel underside 28c is exposed. It is appreciated that the invention may be practiced wherein the channel underside 28c and an upper surface 16c of the semiconductor substrate 16 have profiles that are not flat, such as the triangularly-shaped profiles shown in FIG. 3.

In another embodiment however, the channel underside 28c can be made to have a flat profile, for example by growing an etch stop layer (not shown) on the semiconductor substrate 16 at a desired channel 28 height prior to the third removal. In this embodiment, the third removal can be accomplished by an isotropic etch which forms the open region 32 underling the channel 28 and stops on the etch stop. The etch stop can then be removed, producing a flat profile on the underside 28c of the channel 28.

Figure 4:
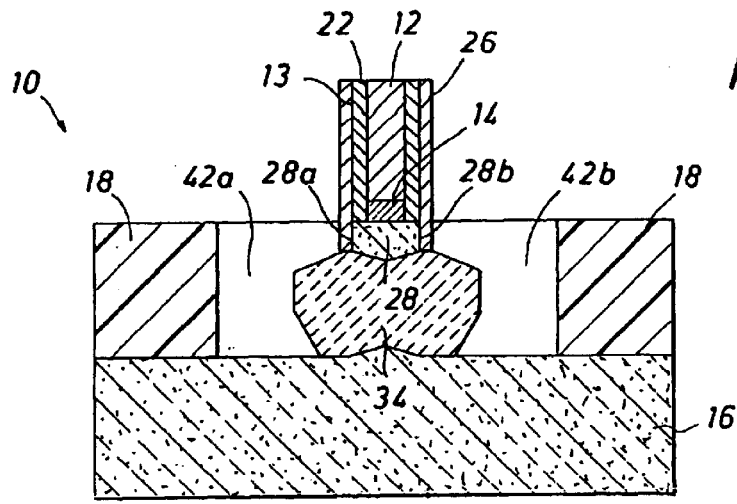
FIG. 4 is a side cross-sectional view of a partially fabricated MOS transistor showing a formation of a strain layer on a portion of an underside of a channel to a structure shown in FIG. 3.

FIG. 4 shows a formation of a strain layer 34 on a portion of the exposed channel underside 28c in the open region 32. The strain layer 34 can be, but is not limited to, silicon germanium or silicon carbide. The invention may also be practiced with strain layers 34 comprised of another semiconductor material provided that the material has a similar dopant as the dopant in the channel 28 (for example, the strain layer 34 and the channel 28 may have different dopants that both produce p-type silicon), but a different crystal lattice structure or a different thermal expansion coefficient than the channel 28, either of which will produce a mechanical stress in the channel 28, thereby increasing the mobility of the carriers in the channel 28. In addition, the strain layer 34 can be comprised of an insulator having a different crystal lattice structure or a different thermal expansion coefficient than the channel 28.

Figure 5:
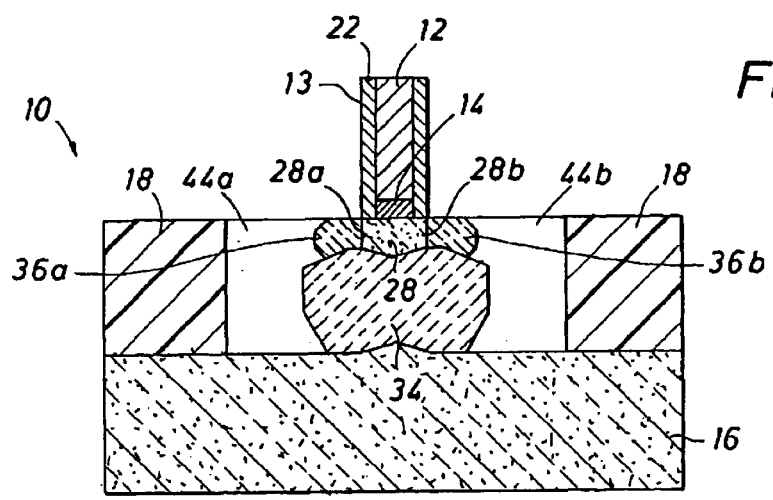
FIG. 5 is a side cross-sectional view of a partially fabricated MOS transistor showing a removal of a set of sidewall spacers and a formation of a source tip and a drain tip adjacent to the sidewalls of the channel to a structure shown in FIG. 4.

It is appreciated that the strain layer 34 can be epitaxially grown on the channel underside 28c, i.e. the stain material 34 can be selectively grown only on crystallographic sites of the channel underside 28c to prevent the strain layer 34 from attaching to the second sidewall spacers 26, thereby facilitating a removal of the second sidewall spacers 26 (shown in FIG. 5).

Although the strain layer 34 is described as being grown only on the channel underside 28c, the invention may be practiced wherein the strain layer 34 grows on both the channel underside 28c and the upper surface 16c of the semiconductor substrate 16. The area remaining in the open region 32 after the formation of the strain layer 34 forms open regions 42a and 42b.

FIG. 5 shows a removal of the second sidewall spacers 26 and a formation of a source tip 36a and a drain tip 36b. The second sidewall spacers 26 are removed to expose the previously protected first sidewall 28a and second sidewall 28b of the channel 28. In one embodiment, the nitride second sidewall spacers 26 are removed by dipping the second sidewall spacers 26 in a solution of hot phosphoric acid. The phosphoric acid removes the nitride second sidewall spacers 26 while leaving the remainder of the transistor 10, such as the first sidewall spacers 22, the channel 28, and the strain layer 34, intact.

Once the sidewalls 28a and 28b are exposed, the source tip 36a is formed on the first sidewall 28a in the open region 42a and the drain tip 36b is formed on the second sidewall 28b in the open region 42b. In one embodiment, the tips 36a and 36b are epitaxially grown on the sidewalls, 28a and 28b to a lateral distance from the sidewalls 28a and 28b in the approximate range of 2 to 500 Angstroms.

The invention may also be practiced wherein the source tip 36a grows on both the first sidewall 28a and the strain layer 34 and the drain tip 36b grows on both the second sidewall 28b and the strain layer 34.

In one embodiment, the tips 36a and 36b are comprised of the same or a similar dopant, having an opposite polarity of the dopant contained in the channel 28. For example the tips 36a and 36b can contain a dopant forming n-type silicon while the channel 28 can contain a dopant forming p-type silicon. The area remaining in the open regions 42a and 42b after the formation of the tips 36a and 36b forms open regions 44a and 44b.

Figure 6:
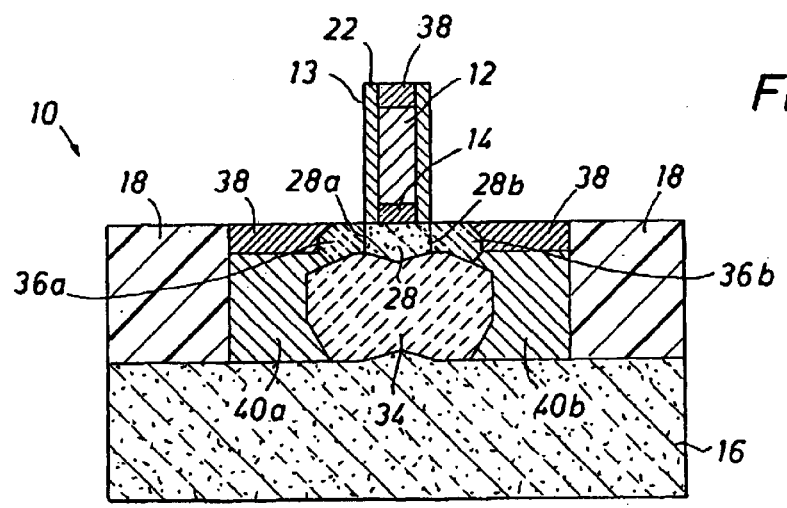
FIG. 6 is a side cross-sectional view of an MOS transistor showing a formation of a source and a drain, and a formation of salicide adjacent to the source, the drain and a gate conductor to a structure shown in FIG. 5.

FIG. 6 shows a source 40a formed in the open region 44a and a drain 40b formed in the open region 44b. Various materials and methods of forming the source 40a and drain 40b may be used to practice the invention. In one embodiment, the source 40a and the drain 40b are formed by growing polysilicon material in the open regions 44a and 44b while simultaneously growing dopants, for example phosphorus, arsenic or boron, onto crystallographic sites in the silicon. The temperature required to grow the dopants onto crystallographic sites in the silicon is in the approximate range of 600° C. to 700° C. In another embodiment the source 40a and drain 40b are formed by epitaxially growing a single crystal of silicon while simultaneously growing dopants onto crystallographic sites in the silicon. Although the source 40a and drain 40b are described as being comprised of silicon other appropriate semiconducting or conducting materials may be used to form the source 40a and drain 40b.

Growing dopants in silicon is in contrast to implanting dopants in silicon, which requires a high temperature activation anneal in the approximate range of 900° C. to 1100° C. to place the dopants on crystallographic sites in the silicon. This high temperature activation anneal tends to relax the strain layer to a lower strain level, usually resulting in dislocations and/or diffusion in the channel crystal, decreasing the desired mechanical stress in the channel. The growth temperature, being significantly lower than the activation anneal, makes it much easier to keep the strain intact and therefore produce the desired mechanical stress in the channel 28, thereby increasing the mobility of the carriers in the channel.

In one embodiment, the source 40a and drain 40b are comprised of silicon having a uniform dopant concentration, for example boron for p-type silicon or arsenic or phosphorous for n-type silicon. In other embodiments, the source 40a and drain 40b have a graded increasing dopant distribution, a graded decreasing dopant distribution, or sections with higher dopant levels than other sections. Varying the dopant distribution within the source 40a and drain 40b varies the conductivity of the source 40a and drain 40b and can be used to help decrease a current leakage and capacitance in the transistor 10.

After the source 40a and the drain 40b are formed, salicide (self-aligned silicide) contacts 38 are formed above the source 40a, the drain 40b and the gate conductor 12, providing good contact surfaces with low resistivity. A variety of techniques, including known techniques, can be used to form the salicide contacts 38. For example, the salicide contacts 38 can be formed by conformally depositing a metal such as nickel, tungsten or cobalt and providing heat so that the metal combines with any exposed silicon, i.e. the silicon from the source 40a, the drain 40b, and the gate conductor 12, to form the salicide. The unreacted metal, such as the metal adjacent to the isolation regions 18 and the first sidewall spacers 22 can be removed by selectively etching any unreacted metal.

Figure 7:
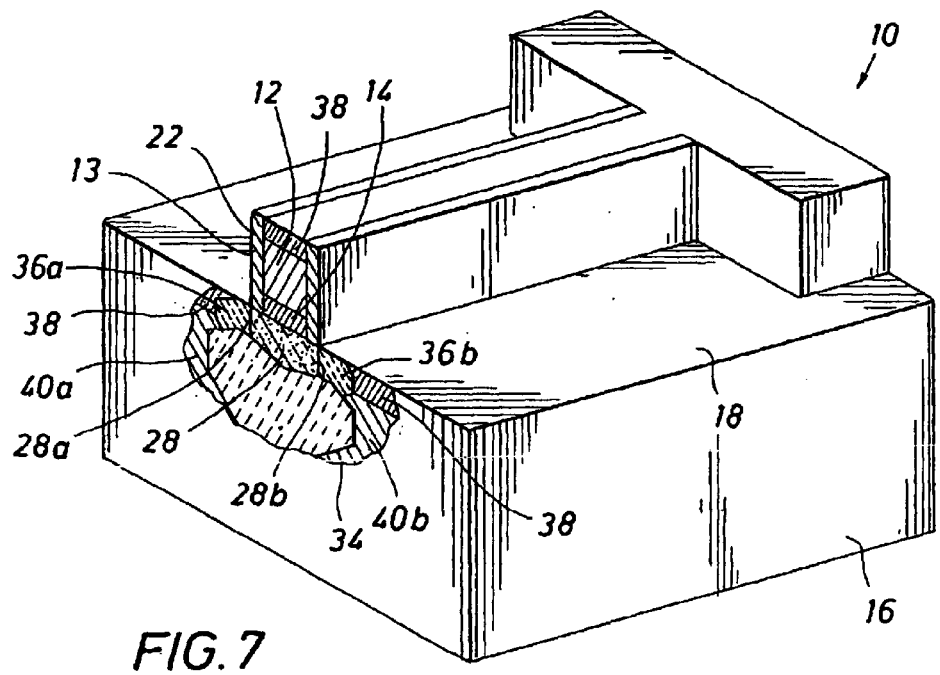
FIG. 7 is an isometric sectional view of an embodiment of an MOS transistor of the present invention.

FIG. 7 shows an embodiment of the invention. In this embodiment, the gate stack 13 is formed above the semiconductor substrate 16. Although a T-shaped gate stack 13 is shown, other configurations may be used to practice the invention. Adjacent to the gate stack 13 is the channel 28. The channel 28 is strained by a strain layer 34, producing a mechanical stress in the channel 28 thereby increasing the mobility of the carriers in the channel 28.

Figure 8:
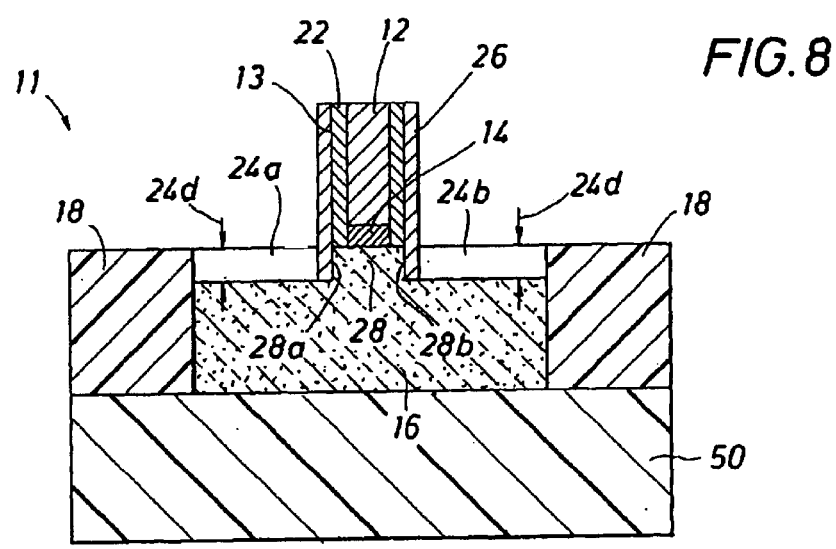
FIG. 8 is a side cross-sectional view of a partially fabricated MOS transistor showing a semiconductor substrate formed adjacent to an insulator. Also shown is a first removal of a portion of the semiconductor substrate and a formation of a set of sidewall spacers.

FIG. 8 shows another embodiment of the invention. The partially fabricated MOS transistor 11 shown in FIG. 8, can be accomplished in the same manner as is described above for the fabrication of the transistor 10 shown in FIG. 1. A difference between the transistor 10 and the transistor 11 is that in the transistor 11, the semiconductor substrate 16 is formed adjacent to an insulation layer 50. The insulation layer 50, like the isolation regions 18, is generally comprised of a dielectric material, such as an oxide. An advantage of forming the semiconductor substrate 16 adjacent to the insulation layer 50, is that the insulation layer 50 helps isolate the transistor 11 from other transistors or devices placed in proximity to the transistor 11.

Figure 9:
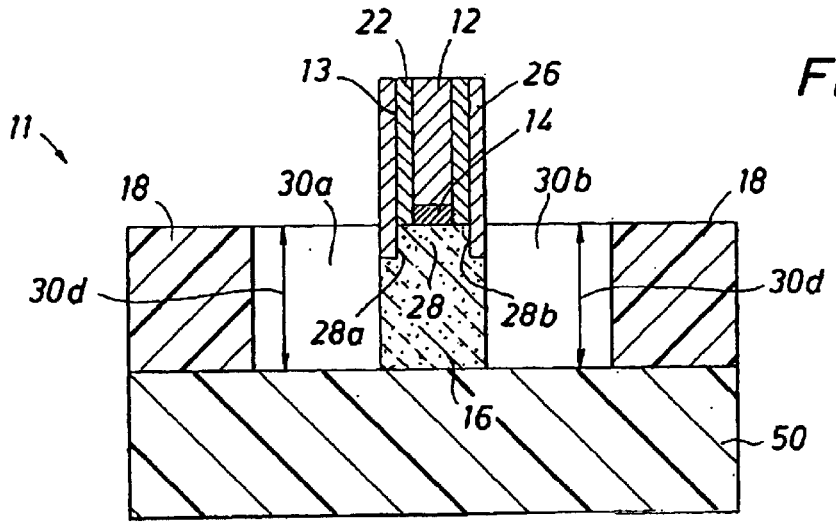
FIG. 9 is a side cross-sectional view of a partially fabricated MOS transistor showing a second removal of a portion of a semiconductor substrate to a structure shown in FIG. 8.

FIG. 9 shows the second removal of a portion of the semiconductor substrate 16. All of the methods described above for the second removal in the transistor 10 shown in FIG. 2 can be used in the transistor 11 shown in FIG. 9. However, in the transistor 11, the insulation layer 50 can function as an etch stop, such that the second removal can be accomplished by an anisotropic etch, etching into the semiconductor substrate 16 until it reaches the insulation layer 50.

Figure 10:
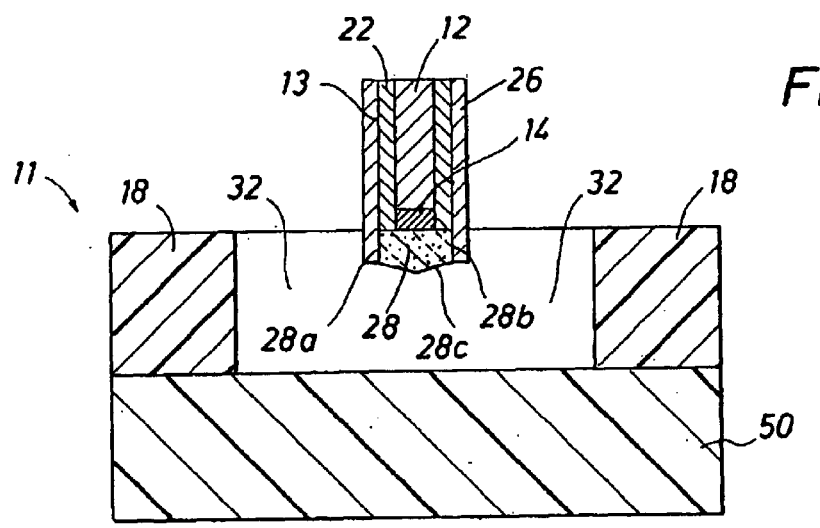
FIG. 10 is a side cross-sectional view of a partially fabricated MOS transistor showing a third removal of a portion of a semiconductor to a structure shown in FIG. 9.

FIG. 10 shows the third removal of a portion of the semiconductor substrate 16. All of the methods described above for the third removal in the transistor 10 shown in FIG. 3 can be used in the transistor 11 shown in FIG. 10. However, in the transistor 11, the insulation layer 50 again functions as an etch stop, allowing for a removal of the remainder of the semiconductor substrate 16, excepting the channel 28.

Figure 11:
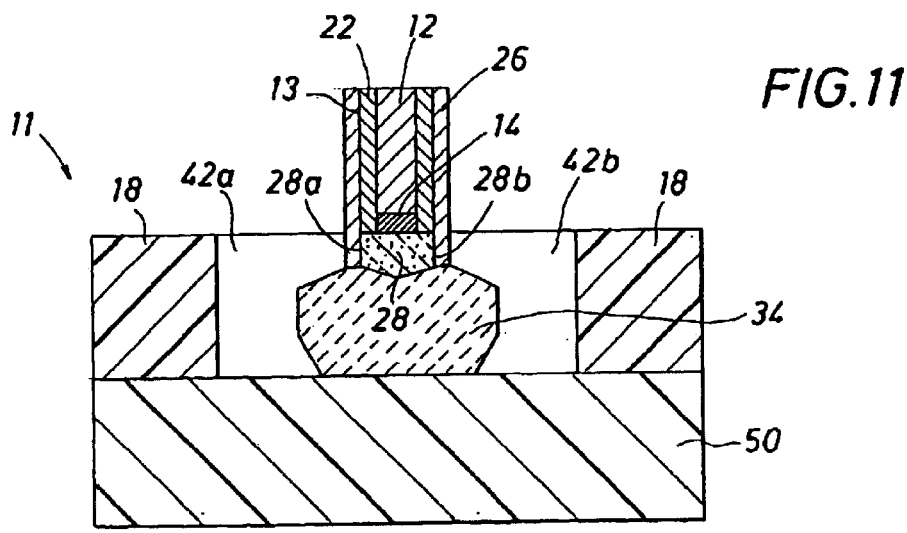
FIG. 11 is a side cross-sectional view of a partially fabricated MOS transistor showing a formation of a strain layer on a portion of an underside of a channel to a structure shown in FIG. 10.

FIG. 11 shows the formation of the strain layer 34 on a portion of the exposed channel underside 28c in the open region 32 of transistor 11. The strain layer 34 can be formed in the same manner as is described above for the transistor 10 in FIG. 4. However, in many cases the strain layer 34 is comprised of a material that does not grow on the insulation layer 50.

Figure 12:
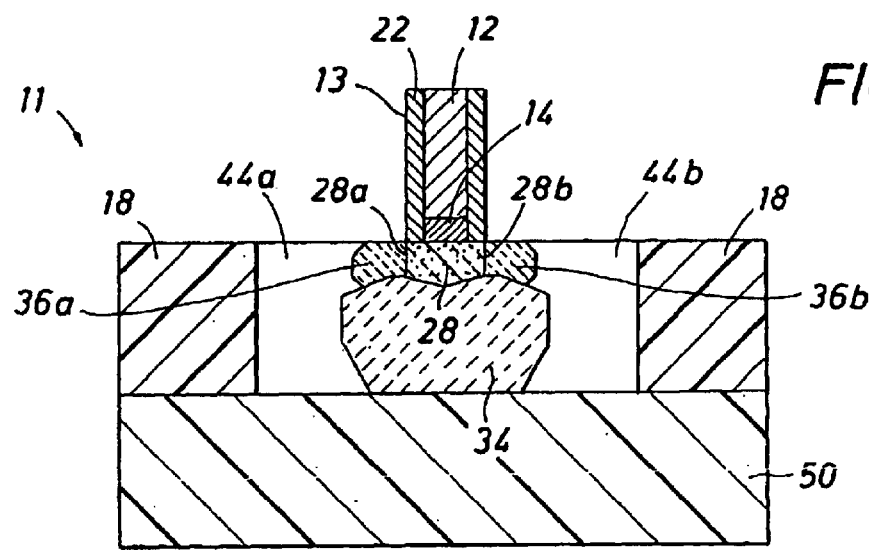
FIG. 12 is a side cross-sectional view of a partially fabricated MOS transistor showing a removal of a set of sidewall spacers and a formation of a source tip and a drain tip adjacent to the sidewalls of the channel to a structure shown in FIG. 11.
Figure 13:
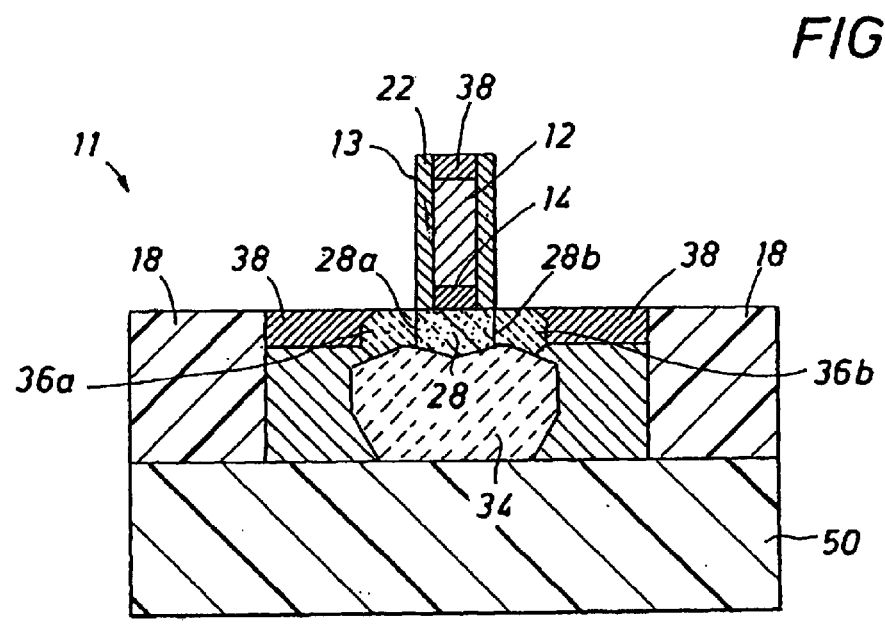
FIG. 13 is a side cross-sectional view of an MOS transistor showing a formation of a source and a drain, and a formation of salicide adjacent to the source, the drain and a gate conductor to a structure shown in FIG. 12.

The transistor 11 shown in FIGS. 12 and 13 can be fabricated in the same manner as is described above for the transistor 10 in FIGS. 5 and 6.

Embodiments of the invention include a transistor having a strain layer formed on an underside of a channel in order to produce a mechanical stress in the channel, increasing the mobility of the carriers in the channel. Embodiments of the invention allow for the production of a greater amount of mechanical stress in the channel, and therefore a greater increase in the mobility of the carriers in the channel than other methods of straining the channel such as depositing a strain layer on the upper surface of the channel.

Although specific embodiments, including specific parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

We claim:

1. A method comprising:
   forming a gate stack over a semiconductor substrate;
   removing a portion of the semiconductor substrate to form an open region but retaining a portion of the semiconductor substrate under the gate stack to define a channel in which the open region underlies the channel exposing a portion of an underside of the channel; and
   forming a strain layer in the open region on a portion of the exposed underside of the channel.

2. The method of claim 1, wherein the removing includes a first etch, the first etch being a vertical anisotropic etch into the semiconductor substrate, self-aligned with the gate stack, to form the open region to a depth below the gate stack in the approximate range of 30 to 200 Angstroms, the depth defining a channel thickness.

3. The method of claim 2, wherein a set of sidewall spacers are formed adjacent to the channel to protect a first sidewall and a second sidewall of the channel.

4. The method of claim 3, wherein the removing further includes a second etch, the second etch being a vertical anisotropic etch into the semiconductor substrate aligned with the sidewall spacers extending the open region to a depth below the sidewall spacers in the approximate range of 50 nanometers to 1 micron.

5. The method of claim 4, wherein the removing further includes a third etch, the third etch being an isotropic etch into the semiconductor substrate extending the open region to the underside of the channel.

6. The method of claim 5, wherein the sidewall spacers are removed and a source tip is formed in the open region adjacent to the first sidewall of the channel and a drain tip is formed in the open region adjacent to the second sidewall of the channel.

7. The method of claim 6, wherein a source is formed in the open region adjacent to the source tip and a drain is formed in the open region adjacent to the drain tip.

8. The method of claim 7, wherein the source and drain have a graded dopant distribution.

9. A method comprising:
   forming a semiconductor substrate above an insulation layer;
   forming a gate stack above the semiconductor substrate;
   removing a portion of the semiconductor substrate to form an open region but retaining a portion of the semiconductor substrate under the gate stack to define a channel in which the open region underlies the channel exposing a portion of an underside of the channel; and
   forming a strain layer in the open region on a portion of the exposed underside of the channel.

10. The method of claim 9, wherein the removing includes a first etch, the first etch being a vertical anisotropic etch into the semiconductor substrate, self-aligned with the gate stack, to form the open region to a depth below the gate stack in the approximate range of 30 to 200 Angstroms, the depth defining a channel thickness.

11. The method of claim 10, wherein a set of sidewall spacers are formed adjacent to the channel to protect a first sidewall and a second sidewall of the channel.

12. The method of claim 11, wherein the removing further includes a second etch, the second etch being a vertical anisotropic etch into the semiconductor substrate aligned with the sidewall spacers extending the open region to a depth below the sidewall spacers in the approximate range of 50 nanometers to 1 micron.

13. The method of claim 12, wherein the removing further includes a third etch, the third etch being an isotropic etch into the semiconductor substrate extending the open region to the underside of the channel.

14. The method of claim 13, wherein the sidewall spacers are removed and a source tip is formed in the open region adjacent to the first sidewall of the channel and a drain tip is formed in the open region adjacent to the second sidewall of the channel.

15. The method of claim 14, wherein a source is formed in the open region adjacent to the source tip and a drain is formed in the open region adjacent to the drain tip.

16. The method of claim 15, wherein the source and drain have a graded dopant distribution.

* * * * *